United States Patent [19]

Cade et al.

[11] Patent Number: 4,599,792
[45] Date of Patent: Jul. 15, 1986

[54] BURIED FIELD SHIELD FOR AN INTEGRATED CIRCUIT

[75] Inventors: Paul E. Cade, Colchester; Badih El-Kareh, Milton; Ick W. Kim, St. Albans, all of Vt.

[73] Assignee: International Business Machines Corporation, Armonk, N.Y.

[21] Appl. No.: 620,982

[22] Filed: Jun. 15, 1984

[51] Int. Cl.$^4$ .................. H01L 21/20; H01L 21/31
[52] U.S. Cl. .................. 29/576 W; 29/576 E; 29/577 C; 29/580; 148/DIG. 25; 148/DIG. 50; 148/DIG. 135; 148/187
[58] Field of Search .............. 29/576 W, 576 E, 571, 29/577 C, 580; 148/DIG. 26, DIG. 25, DIG. 50, DIG. 135, 187; 357/34, 49, 53

[56] References Cited

U.S. PATENT DOCUMENTS

| | | | |
|---|---|---|---|
| 3,846,198 | 11/1974 | Wen et al. | 156/17 |
| 3,959,045 | 5/1976 | Antypas | 156/3 |
| 4,089,021 | 5/1978 | Sato et al. | 357/20 |
| 4,290,831 | 9/1981 | Ports et al. | 148/187 |
| 4,404,737 | 9/1983 | Kanzaki et al. | 29/577 C |
| 4,408,386 | 10/1983 | Takayashiki et al. | 29/576 E |

OTHER PUBLICATIONS

Jastrzebski, "Comparison of Different SOI Technologies" RCA Review, vol. 44, Jun. 1983, pp. 251-269.
Kimura et al., "Epitaxial Film Transfer Technique" Applied Physics Letter 43(3), Aug. 1, 1983, pp. 263-265.

Primary Examiner—Aaron Weisstuch
Assistant Examiner—T. Quach
Attorney, Agent, or Firm—Sughrue, Mion, Zinn, Macpeak, and Seas

[57] ABSTRACT

A method for fabrication of a buried field shield in a semiconductor substrate. A seed substrate is prepared by depositing an epitaxial layer or a seed wafer and then depositing a heavily doped layer and a thin dielectric. The thin dielectric is patterned for contact holes and then a conductive field shield is deposited and patterned. A thick quartz layer is deposited over the field shield and dielectric. A mechanical substrate is anodically bonded to the quartz of the seed substrate and the original seed wafer is etched back to expose the epitaxial layer for further fabrication.

10 Claims, 17 Drawing Figures

BURIED FIELD SHIELD FOR AN INTEGRATED CIRCUIT

DESCRIPTION

Field of Invention

The invention pertains generally to integrated circuits. In particular, it pertains to the fabrication of a buried field shield beneath other semiconductor devices on an integrated circuit chip.

BACKGROUND OF THE INVENTION

A technology for integrated circuits must be judged on at least two criteria besides the obvious need for practicality of fabrication. The devices should be densely packed on the integrated circuit to allow a large number of individual devices on a small area chip. Furthermore, the devices must be fast so that the integrated circuit has a high throughput. The speed of most technologies is limited by stray capacitance, both between devices and to the substrate. Many recent designs, such as those disclosed by Rao in U.S. Pat. No. 4,388,121 and by Koomen et al in U.S. Pat. No. 4,317,690, have attempted to reduce the area by using multi-layer structures so that two separate elements are occupying the same surface area and no area is occupied by their interconnects. This approach, however, introduces capacitance between the layers. Furthermore, these devices are usually built on a semiconductor substrate so that there is an unavoidable capacitance to the substrate. It should be noted that, in some situations, a high capacitance is desired, such as in dynamic memory cells. If the capacitance per area of the memory cell can be increased, the total area of the memory cell can be decreased, resulting in a high chip density. A further advantage of high capacitance for small area memory cells is the immunity to alpha particles. Thus, it is desirable to simultaneously have low capacitance and high capacitance areas on the same integrated circuit.

One technology that eliminates substrate capacitance is silicon on sapphire (SOS). In SOS, a layer of silicon is grown on top of an insulating sapphire substrate. As a result, substrate capacitance is negligible. However, SOS tends to require fairly large surface areas and multi-layer SOS devices are not common.

A recent variant of SOS is silicon on insulator (SOI), in which a silicon layer is formed on top of a layer of silicon dioxide. A description of SOI technology is contained in a technical article by A. Jastrzebski, appearing in the RCA Review, Vol. 44, June 1983 at pp.250-269 and entitled "Comparison of Different SOI Technologies: Assets and Liabilities".

SUMMARY OF THE INVENTION

Accordingly, it an object of this invention to provide for the fabrication of dense integrated circuits.

It is a further object of this invention to provide for the fabrication of multi-layered devices on an integrated circuit chip.

It is yet a further object of this invention to provide both high and low capacitance areas on the same integrated circuit chip.

The invention provides a buried conductive field shield separated by a thin dielectric layer from the epitaxial region in an SOI integrated circuit. The epitaxial layer is grown upon a seed wafer and the thin dielectric layer and the conductive shield are deposited upon the epitaxial layer. A thick layer of quartz is then deposited and the quartz is mechanically bonded to a mechanical substrate. The original seed wafer is then removed to expose the epitaxial layer for definition of the integrated circuit. The field shield lies beneath the epitaxial layer and can be used for high capacitance elements, for buried wiring and for shielding the epitaxial layer against of migration of mobile ions from the quartz.

DETAILED DESCRIPTION OF THE PREFERRED EMBODIMENTS

This invention provides a simple method for fabricating a buried field shield in an integrated circuit. The buried field shield is a thin conductive layer that lies below a semiconductor region in the integrated circuit chip and is separated from the semiconductor region by a thin dielectric layer. Such a buried field shield can be used, for example, for memory storage cells and produces additional dielectric film capacitance below the active devices without increasing the required surface area. The method of this invention relies upon a recently developed technique for fabricating a buried insulating layer in a semiconductor material. This method is based on disclosures by Pomerantz in U.S. Pat. No. 3,595,719, and Antypas in U.S. Pat. No. 3,959,045, and Kimura et al in a technical article entitled "Epitaxial Film Transfer Technique for Producing Single Crystal Si Film on an Insulating Substrate" appearing in Applied Physics Letters, Vol. 43, No. 3, Aug. 1, 1983 at Pages 263-265. Additional references for the bonding of two wafers are U.S. Pat. Nos. 3,332,137, 4,384,899 and 4,389,276, German Patentschrift b. 593,559 and Japanese patent document No. 56-106430.

Figure 1:
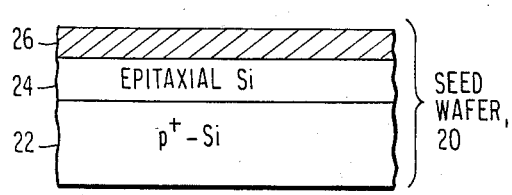
FIGS. 1-3 illustrated a conventional method of producing a silicon on insulator structure by anodic bonding.

A seed wafer 20, illustrated in FIG. 1, is prepared from a (100) silicon wafer 22. For sake of example, let the silicon wafer 22 have p+ doping.

A silicon epitaxial layer 24 is grown on top of the silicon wafer 22. An insulating layer 26 is then formed on top of the epitaxial layer 24 by depositing a boron-rich quartz. This quartz can be a borosilicate glass which matches the thermal expansion properties of silicon.

Figure 2:
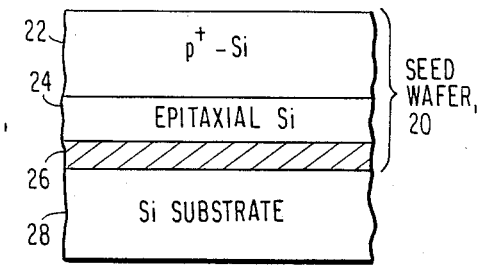

A seed wafer 20 is then placed on top of a silicon substrate wafer 28 with the insulating layer 26 contacting the substrate layer 28, as shown in FIG. 2. The two wafers 20 and 28 are then Mallory or anodically bonded by the method taught in the previously cited U.S. Pat.

No. 3,595,719. This bonding forms a true hermetic seal between the two wafers 20 and 28. The formation and nature of this bonding seal are described by Wallis et al. in an article entitled "Field Assisted Glass Metal Sealing" appearing in the *Journal of Applied Physics,* Vol. 40, No. 10, 1969 at page 3946 and by Brooks et al. in an article entitled "Low Temperature Electrostatic Silicon to Silicon Seals Using Sputtered Borosilicate Glass" appearing in the *Journal of the Electrochemical Society,* Vol. 119, No. 4, 1972 at page 545.

Figure 3:
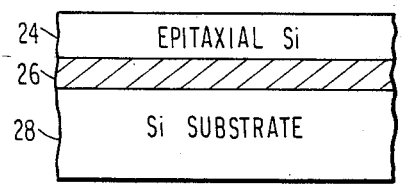

The bonded wafers 20 and 28 are then dip etched to remove the region of the silicon wafer 22 and to produce the structure illustrated in FIG. 3. This structure has a surface epitaxial layer 24 separated from the silicon substrate 28 by the insulating layer 26. One of the purposes of this invention is to provide a method of defining elements below the insulating layer 26 and to use parts of that layer 26 as field barriers. It should be recognized that if elements had been defined in the silicon substrate 28 before the anodic bonding it would be difficult to align to those elements because of the featureless epitaxial surface of the structure of FIG. 3.

Figure 4:
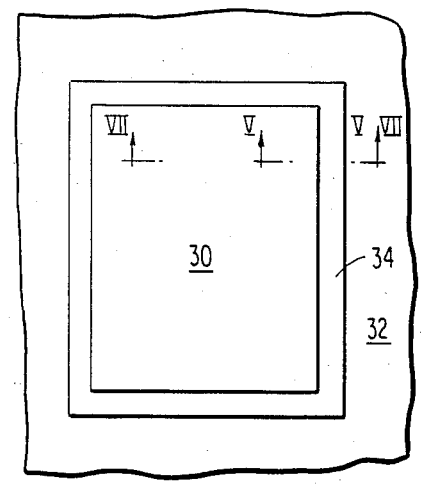
FIG. 4 illustrates a die and its kerf region.

In integrated circuit fabrication, a wafer usually contains many dice. Each die is a complete integrated circuit and the circuit pattern is replicated among a large number of dice. A die 30 is shown in FIG. 4 on a wafer 32. It is to be understood that the die is repeated in two dimensions in a rectangular close packed structure. However, surrounding each die 30 is a kerf region 34. When the wafer fabrication is completed, a mechanical saw is applied to the kerf region 34 between the dice 30, thereby separating the dice but also destroying the kerf region 34. In one embodiment of the present invention, alignment marks are put in the kerf region 34 in order to allow proper registration between different levels of the semiconductor fabrication. Alternatively, the alignment marks can be put into peripheral regions of the wafer 32. Providing for the alignment marks is one of the first steps in one of the embodiments in this invention.

Figure 5:
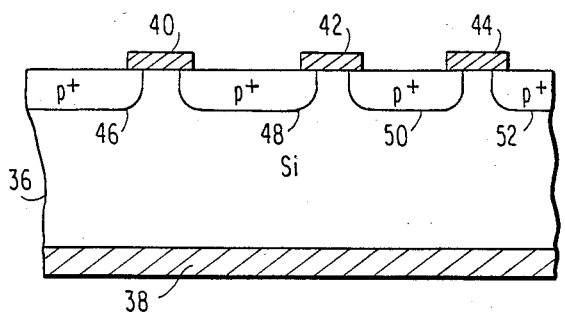
FIG. 5 is a cross-sectional illustration of a first step of one embodiment of the present invention.

Processing in a first embodiment of the invention begins with a cleaned standard silicon wafer 36, shown in FIG. 5, with n⁻ or p⁻ doping and an exposed (100) face. The wafer 36 has a back-side protect 38 such as an oxide or $Si_3N_4$. A diffusion masking oxide is grown on the front surface of the wafer 36 and this oxide is opened in a photoresist masking step to leave a series of small blocking oxide regions 40, 42 and 44. The pattern of the oxide regions 40–44 provides the alignment marks, illustrated in FIG. 6. The illustrated pattern is for five marks but other patterns can be used. All the alignment marks should appear in the anticipated kerf region 34 or alternatively in the wafer periphery. Multiple sets of alignment marks are required for the integrated circuit but it is not necessary that they appear next to each die 30. Then a p⁺ boron deposition and diffusion are made to provide a precision etch stop consisting of multiple stop regions 46, 48, 50 and 52, shown in FIG. 7. The p⁺ doping is $5 \times 10^{19}/cm^3$ or above. It is to be understood that the stop region 46 extends over a substantial area of the die 30.

Figure 7:
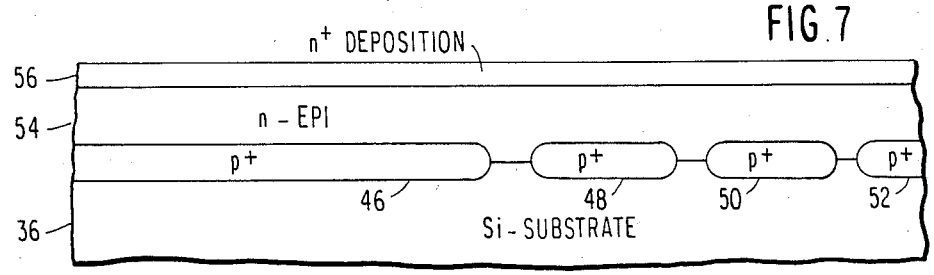
FIGS. 7-11 and 13 are cross-sectional illustrations of further steps in the first embodiment, with FIG. 13 being the final structure.

The front side blocking oxide regions 40–44 are then removed and an n-type epitaxial layer 54 is grown on top of the silicon wafer 36 and its stop regions 46–52, as shown in FIG. 7.

A standard n⁺ emitter layer 56 is applied on top of the epitaxial layer 54. The emitter layer 56 can be either blanket diffused or result from an ion implantation of the epitaxial layer 54. If desired, the emitter layer 56 could have been masked into individual regions for further device definition utilizing the alignments marks shown in FIG. 6.

Figure 6:
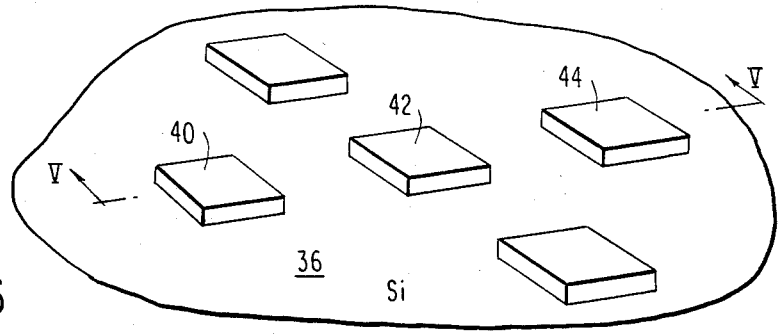
FIG. 6 illustrates alignment marks on a wafer.
Figure 8:
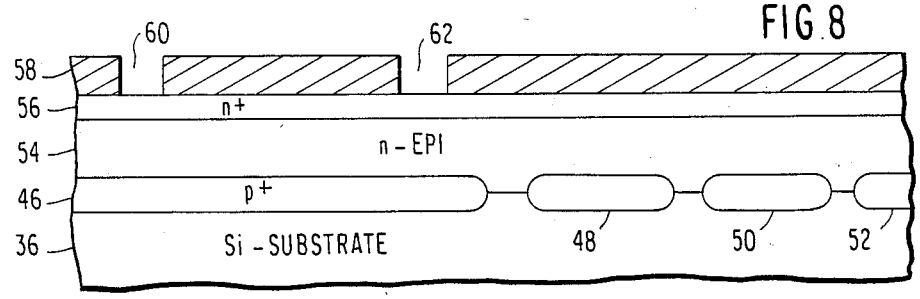

A thin gate dielectric layer 58 is then grown or deposited over the surface of the emitter layer 56, as shown in FIG. 8. The thickness of the dielectric layer 58 is somewhat arbitrary. A thin layer provides high capacitance but current technology sets a minimum thickness of 5 nm to prevent defects. Its composition is also somewhat arbitary but good adhesion to silicon is required. Dielectric layers 58 of $SiO_2$ are acceptable or a thin layer of $SiO_2$ for adhesion combined with a thicker $Si_3N_4$ layer may be used. Although the alignment marks of FIG. 6 are buried, they are apparent through the overlaying layers. Using these alignment marks, the gate dielectric layer 58 is patterned by standard photolithographic techniques to produce the structure shown in FIG. 8. The patterns on the dielectric layer 58 provide openings 60 and 62 which will define the contact to the field shield to be grown later. It should be noted that FIG. 8 includes a larger portion of the area of the die 30 along the cross-sectional line VII—VII rather than along the shorter cross-sectional line V—V, which concentrates on the kerf region 34. Although FIG. 8 illustrates that the openings 60 and 62 are linear with the stop regions 48–52 defining the alignment marks, in fact, the openings 60 and 62 may be of any number and located anywhere within the area of the die 30 independently of the location of the alignment marks within the kerf region 34.

In the embodiment illustrated in FIG. 8, the dielectric layer 58 is a single thickness. However this layer 58 can be patterned to different thickness if high capacitances are desired for only a portion of the integrated circuit while low capacitances are desired in other portions where the field shield is being used not as a capacitor but for wiring or for a shield against mobile ions.

Figure 9:
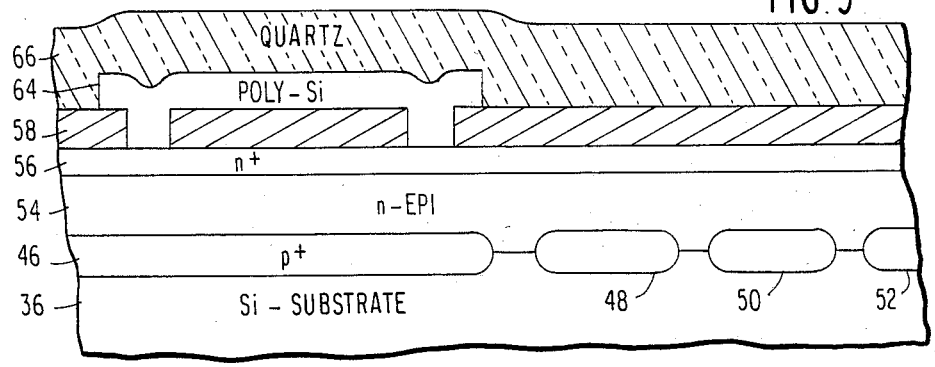

Then a layer of doped polysilicon or silicide or some other conductor is deposited on top of the gate dielectric layer 58 and is photo-lithographically defined, as shown in FIG. 9, to form a field shield 64. In one embodiment, the field shield 64 extends over the major portion of the area of the die to provide a field shield for nearly the entire integrated circuit. In other embodiments, the field shield 64 is used for buried wiring so that its patterning is complex.

In the final step of the preparation of the seed wafer, an insulating SOI (silicon on insulator) layer 66 is deposited on top of the gate dielectric 58 and the field shield 64. The SOI insulating layer 66 should be a boron-rich glass which is deposited over the entire area either by sputtering or perhaps by chemical vapor deposition. An example of such a material is quartz. The sputtering procedure is described by Brooks et al in the previously cited article and the CVD process is described by Werner Kern in a technical article entitled "Chemical Vapor Deposition of Inorganic Glass Films" appearing in Semiconductor International, March 1982 at pp. 89–103. Note that the thick quartz layer 66 tends to planarize the surface to a limited extent. The quartz should match the thermal expansion coefficient of silicon. This condition is satisfied by a 17% boron content. Phosphorous rich glasses or a combination of phosphorous and boron can be used but a higher phosphorous content is required for the thermal matching. Sodium, such as is contained in PYREX, should not be used because of its degradation of dielectric-semiconductor interfaces. The thickness of the quartz should be in the range of 5-10 μm to minimize capacitance to the substrate. The back-side protect 38 is removed at this point. The resultant structure of FIG. 9 is the completed seed wafer that is used in SOI fabrication similarly to the seed wafer 20 of FIG. 1.

Figure 10:
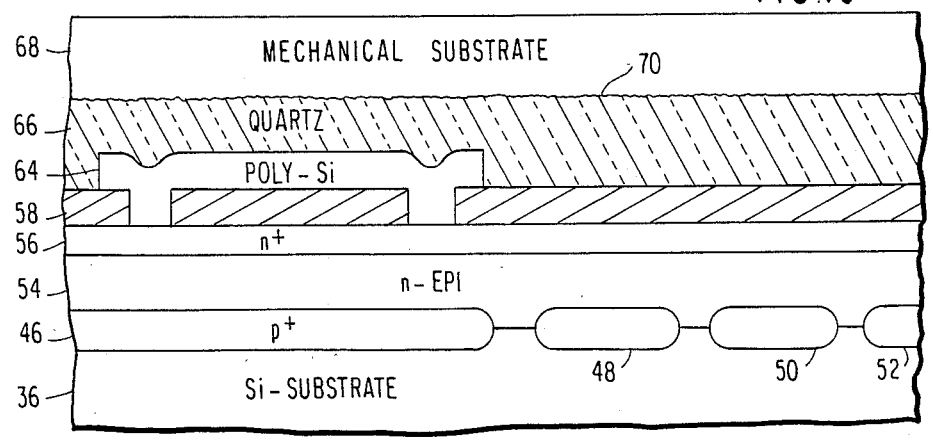

The seed substrate of FIG. 9 is then anodically bonded to a mechanical substrate 68 as shown in FIG. 10. The mechanical substrate 68 may be a wafer of crystalline silicon. The bonding voltages for a quartz layer of 7 μm thickness is in the range of 35-50 V. There are a number of important points to be explained for this bonding step. The field shield 64 is at the same potential as the seed substrate 36 during bonding, thereby preventing an electrostatic field build-up across the thin insulating gate dielectric 58. The polysilicon or other material in the field shield 64 provides a diffusion barrier against any mobile ions which might otherwise migrate from the boron-rich quartz 66 into the thin dielectric region 58 beneath the field shield 64. These mobile ions would cause problems with the subsequent operation of the fabricated devices in the area of the die. The field shield 64 can be used, not for its electrical characteristics, but as a diffusion shield against mobile ions migrating from the quartz 66.

The regions where the polysilicon field shield does not protect the thin insulating gate layer 58 are nonetheless protected from inversion by the n+ stop layer 56 on top of the epitaxial layer 54.

The non-planarity of the quartz surface, illustrated in FIG. 9, is not a major concern for the Mallory or anodic bonding. In fact, anodic bonding has been demonstrated on top of aluminum wiring patterns. Such successful bonding over defined features is described in a technical article by Roylance et al. entitled "A Batch-Fabricated Silicon Accelerometer" and appearing in *IEEE Transactions on Electron Devices*, Vol. ED-26, No. 12, 1979 at page 1911 and in a technical article by Sander et al., entitled "Monolithic Capacitive Pressure Sensor With Pulse-Period Output" and appearing in *IEEE Transactions on Electron Devices*, Vol. ED-27, No. 5, 1980 at page 927. It has been suggested that the high energy density pulse at the initial phase of the anodic bonding increases the temperature at the local bonding site by as much as 560° C. which allows microscopic reflow of the quartz around non-planar features. However, we believe that the high local pressure causes a temporary decrease of the quartz viscosity around any protrusion of the bond interface. The reflow process has been described in the previously cited articles by Wallis et al and Ramiller et al.

The electrostatic field and microscopic fusing occurs at the interface 70 between the quartz 66 and the mechanical substrate 68, thereby eliminating the possible problem mentioned by Barth in an article entitled "Silicon Sensors Meet Integrated Circuits" appearing in *IEEE Spectrum*, September 1981, at page 33. This problem concerns possible damage to existing semiconductor structures caused by electrostatic discharges induced by the anodic bonding. The epitaxial layer 54 of the seed wafer is far removed from the bonding activity at the interface 70. It is the mechanical substrate 68 that suffers the electrical surface property degradation during bonding, not the silicon substrate 36 of the seed wafer or its epitaxial layer 54.

Figure 11:
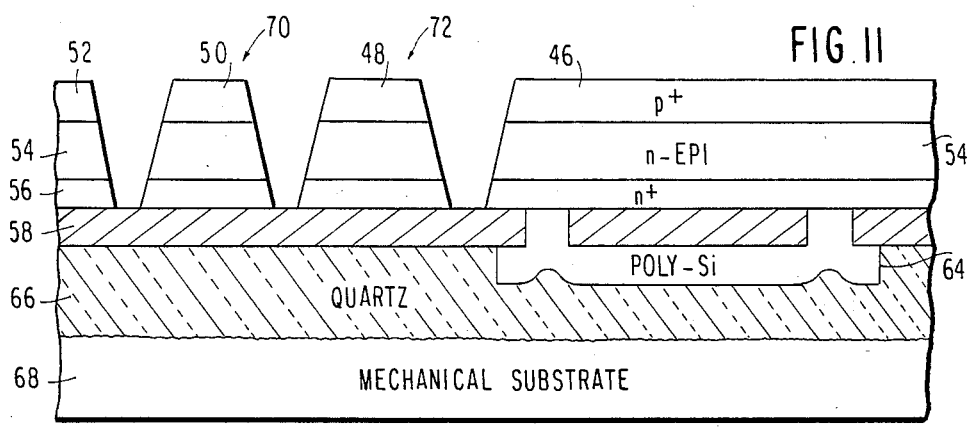
Figure 12:
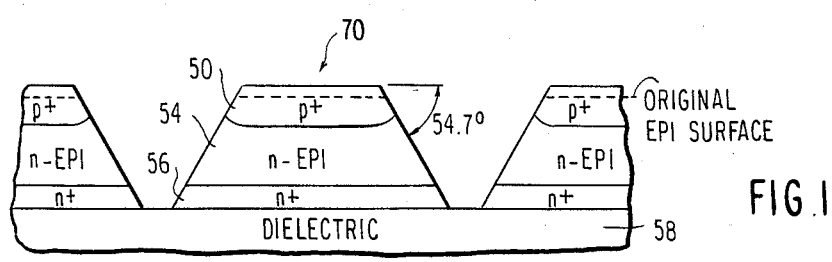
FIG. 12 is an enlarged cross-sectional view of an alignment mark.

The bonded wafer pair of FIG. 10 is then dip etched, perhaps using an anisotropic etch such as ethylene diamine pyrocatacol (EDP) to remove all the silicon in the seed wafer down to the p+ gate etch stop 46 in a process called etch-back. The use of EDP is described by Kurt Petersen in a technical article entitled "Silicon as a Mechanical Material" appearing in the IEEE Proceedings, Vol. 70, No. 5, May 1982 at pp. 420-457. It should be noted that the backside of the mechanical substrate needs to be protected by an oxide during the etch-back. For a quicker etch, a majority of the etching is performed with a caustic with the final anisotropic etch done by EDP. The general principle of the EDP etch-back is that EDP readily etches silicon with doping concentrations below $10^{19}/cm^3$ but is ineffective at etching the p+ etch stop having a doping concentration above $5 \times 10^{19}/cm^3$. The resultant structure is shown in FIG. 11 in which the wafers have been turned upside-down from FIG. 10. However, in the vicinity of the alignment marks, the etch stop regions 46-52 are not continuous so that the etching in that region continues into the epitaxial layer 54 to form pyramids 70 and 72. The structure of one pyramid 70 is shown more accurately and in more detail in FIG. 12. The sides of the pyramid 70 slope at an angle of 54.7° with respect to the surface because of the anisotropic nature of the etch. The etching, however, stops at the interface with the dielectric layer 58 with no additional undercutting if the wafer is left in the etch bath for more than the normal time. The pyramids 70 and 72 or the valleys between them provide alignment marks on an otherwise featureless surface of the p+ etch stop layer 46. The pyramids 70 and 72 are necessarily aligned with whatever definition has been previously performed on the dielectric layer 58 or the field shield 64.

Figure 13:
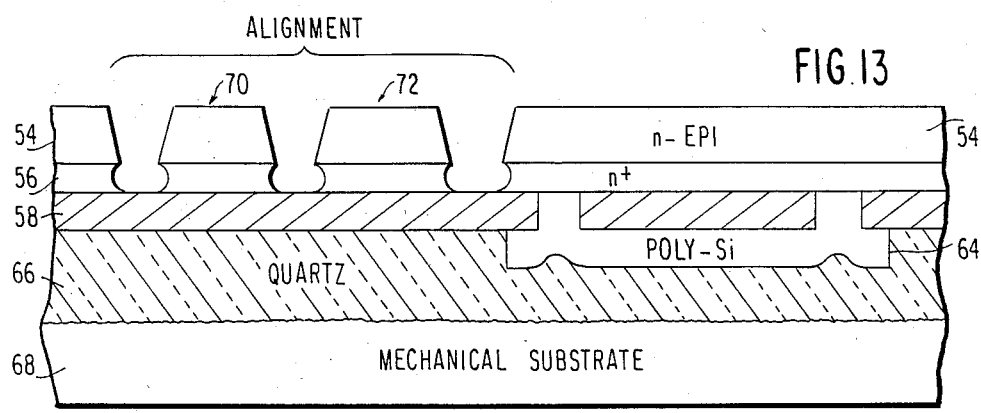
Figure 14:
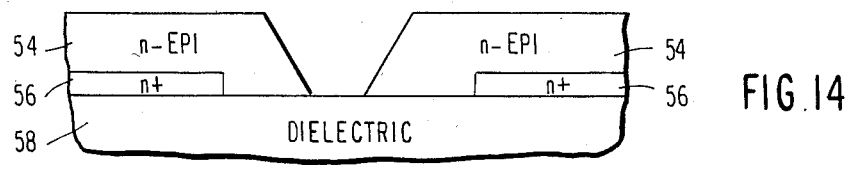
FIG. 14 is an enlarged cross-section of the alignment marks in a variation of the first embodiment.

The p+ stop regions 46-52 are etched away with an echant such as hydroflouric-nitric-acetic acid (HNA) in the proportions 1:3:8 that leaves the structure illustrated in FIG. 13. The etchant is chosen such that it etches only silicon above a certain dopant concentration so that the p+ gate etch stop 46 defines the precise limits of etching. This HNA etchant is described by Muraoka et al. in a chapter entitled "Controlled Preferential Etching Technology" appearing at page 327 in the book "Semiconductor Silicon 1973", Electrochemical Society Symposium Series (Princeton, N.J., 1973), edited by Huff et al. It is also described by Maggiore et al. in an article entitled "Thin Epitaxial dE/dx Detectors" appearing in *IEEE Transactions on Nuclear Science*, Vol. NS-24, No. 1, 1977 at page 104. If the epitaxial layer 54 was applied as a blanket across the entire wafer, as shown in FIG. 7, the final etching step produces undercutting of the pyramids 70 and 72 beneath the epitaxial layer 54, shown in FIG. 13. If, on the other hand, the deposition of the n+ layer 56 were masked around the alignment marks, as illustrated in FIG. 14, the alignment pit could be left free of the n+ layer 56. Then the HNA etch, intended for the etch stop layer 46, would never reach the n+ layer 56, thus preventing undercutting. This additional masking of the n+ layer 56 could also be used for buried device fabrication within the area of the die 30. Note that since the alignment marks appear in the kerf region 34, they would vanish upon dicing, thus not revealing how the alignment to the buried structure was accomplished.

Transistors have been fabricated with the above approach but have been found to suffer unacceptable current leakage. It has been determined that when the etch stop regions 46-52 have doping levels above $3 \times 10^{19}/cm^3$, crystal slips form therein. These slip defects propagate through the epitaxial layer 54 producing the observed degradation. Accordingly, a second and preferred embodiment of the invention has been developed using a different etch-stop technique and using laser scribing for back-side alignment.

Figure 15:
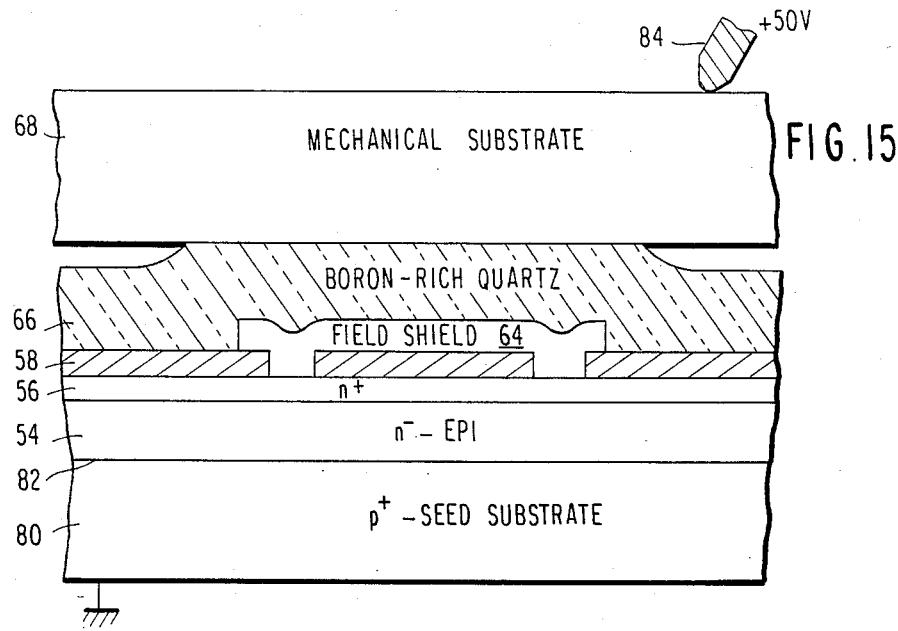
FIGS. 15 and 16 are cross-sectional illustrations of steps in a second and preferred embodiment of the invention.

Fabrication in the second embodiment begins with a heavily doped p+ seed substrate 80, shown in FIG. 15, on which is grown the n− epitaxial layer 54. There is no explicit etch-stop in this embodiment but the interface 82 between the lightly doped n− epitaxial layer 54 and the heavily doped p+ seed substrate 80 provides the etch stopping characteristics to be described later. Then the n+ emitter layer 56 and the thin dielectric layer 58 are grown just as in the first embodiment.

At this point, a laser is used to provide alignment marks on the dielectric layer 58. This procedure is described in a patent application Ser. No. 620,644 filed by one of the inventors, P. Cade on June 14, 1984 now U.S. Pat. No. 4,534,804 and entitled, "Laser Process for Forming Identically Positioned Alignment Marks on the Opposite Sides of a Semiconductor Wafer." The advantage of the laser scribing techniques is that the laser scribed marks propagate from the surface of the dielectric layer 58 through at least the epitaxial layer 54, thus providing back-to-front registry.

The field shield 64 and the boron-rich quartz 66 are likewise formed by similar procedures using the laser-scribed alignment marks for any required definition including possible definition of the emitter layer 56. The mechanical substrate 68 of silicon is then anodically bonded to the quartz 66 by applying voltage to a voltage probe 84 with the seed substrate 80 grounded.

Figure 16:
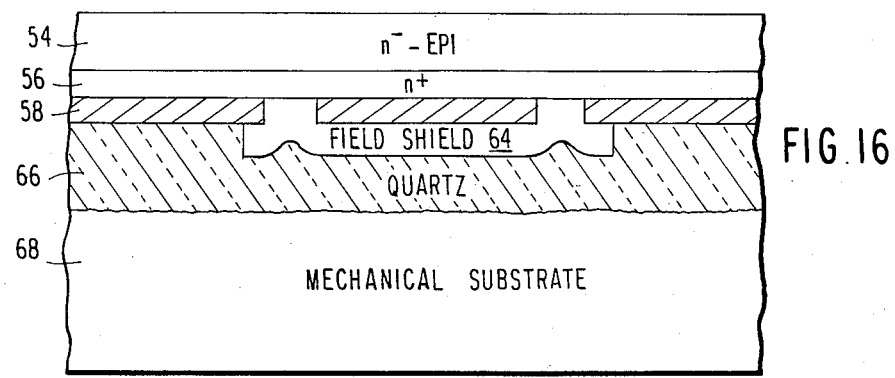

The etch-back of the seed substrate 80 is performed with hydrofluoric-nitric-acetic acid (HNA) in the proportions of 1:3:8. The etchant HNA is an isotropic etch and attacks heavily doped p+ or n+ silicon. However, it does not appreciably attack silicon doped below the level of $10^{18}/cm^3$. The etch stopping characteristics are improved by the p+/n junction at the interface 82. In order to prevent the etching of the silicon mechanical substrate 68 the backside of the mechanical substrate is protected with an oxide during the etch-back. However, the HNA etchant also attacks silicon oxide to some degree. Accordingly, the etching is divided into two steps. The first major part of the etching is performed with a caustic. The final part of the etch is performed with HNA to provide the precise etch-stopping characteristics. Whatever etching of the oxide protect of the mechanical substrate 68 occurs is insufficient to break through the oxide protect. The resultant structure after the etch-back is illustrated in FIG. 16. Not shown in this figure are the laser scribed registration marks which are visible at the top side of the epitaxial layer 54 on an otherwise featureless surface. These etch marks are aligned with the field shield 64 and whatever definition has been performed in the emitter layer 58. It is seen that structure of FIG. 16 closely resembles that of FIG. 13, except for the alignment marks.

At this point, normal processing of the substrate of either FIGS. 13 or 16 proceeds upon the area of the die 30 which has a smooth surface of the epitaxial layer 54 and has a buried field shield 64 underlying that die area. The pyramids 70 and 72 or the laser scribes are used as precision alignment marks to the buried structure of the dielectric layer 58 and the field shield, not themselves visible. It is anticipated that the n+ region 56 is delineated on top of the dielectric layer 58 so that devices, such as capacitors, can be fabricated using both the insulating layer 58 and the field shield 64 as constituent elements.

Figure 17:
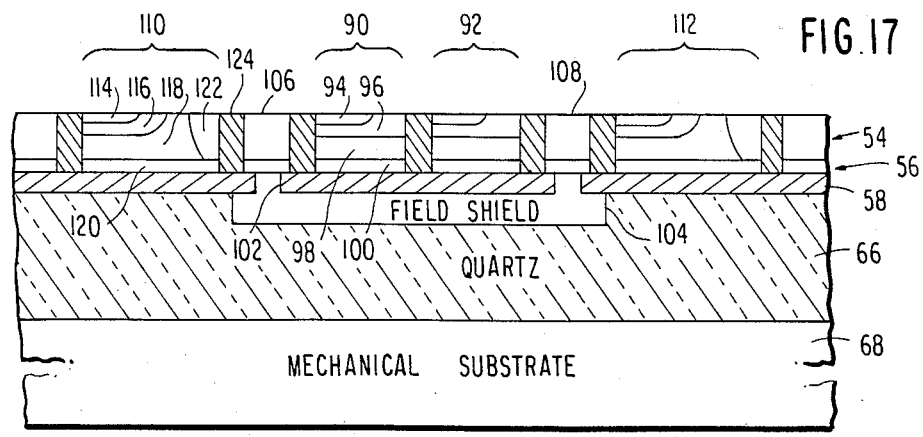
FIG. 17 is a cross-sectional illustration of a circuit that can be produced by means of the invention.

An example of an integrated circuit built using the substrate of this invention is illustrated in FIG. 17. Two storage cells 90 and 92, chosen for illustrative purposes, each has a vertical transistor consisting of a diffused n+ region 94, a diffused p region 96 and an epitaxial n region 98. The epitaxial n region 98 is part of the epitaxial layer 54 of the substrate of FIGS. 12 and 14. Underlying the epitaxial n region 98 is an n+ layer 100 which is formed from the emitter step layer 56 of FIGS. 13 and 16. A storage node with high capacitance results from the n+ layer 100, a thin dielectric layer 102 and a buried field shield 104. The dielectric layer 102 and the field shield 104 are equivalent to the corresponding elements 58 and 64 in FIGS. 13 and 16. The field shield 104 is connected to the surface by field shield reach-throughs or contacts 106 and 108. Support transistors 110 and 112 are formed in an area of the die away from the field shield 104. The transistor 110 consists of a diffused n+ region 114, a diffused p region 116 and an n epitaxial layer 118. A planar contact is made to the n epitaxial layer 18 with an n+ layer 120 connected to the surface with a diffused n+ reach-through 122. The support transistors 110 and 112, the field shield contacts 106 and 108 and the storage cells are all isolated by dielectric trenches 124 extending from the surface to the dielectric layer 58. The required surface interconnections are not shown.

Having thus described our invention, what we claim as new, and desire to secure by Letters Patent is:

1. A method of fabricating a semiconductor structure, comprising the steps of:
   depositing an epitaxial semiconductor layer on a first semiconductor substrate;
   forming and patterning a first dielectric layer overlying said epitaxial layer;
   forming a field shield layer of a conductive material on predetermined portions of said first dielectric layer and on predetermined portions of said epitaxial layer;
   covering said field shield layer and all exposed portions of said first dielectric layer and said epitaxial layer with a bonding material;
   bonding a second substrate to the side of said first substrate covered with said bonding material, thereby forming a bonded structure; and
   removing said first substrate from said bonded structure.

2. A method of fabricating a semiconductor structure as recited in claim 1, further comprising the step of:
   forming on said first substrate before the depositing of said epitaxial layer an etch stopping layer; and
   wherein said removing step is an etching step that does not substantially etch said etch stopping layer.

3. A method of fabricating a semiconductor structure as recited in claim 2, wherein;
   said step of forming an etch stopping layer includes patterning said layer to exclude aligning areas; and
   said etching step is an anisotropic etching step.

4. A method of fabricating a semiconductor structure, as recited in claim 1, wherein said removing step is an etching step that does not substantially etch said epitaxial layer.

5. A method of fabricating a semiconductor structure as recited in claim 4, wherein
   the conductivity type of said epitaxial layer is n-type and the doping concentration of said epitaxial layer is equal to or less than $10^{18}/cm^3$; and the conductivity type of said first substrate is p-type and the doping concentration of said first substrate is substantially greater than $10^{18}/cm^3$.

6. A method of fabricating a semiconductor structure as recited in claim 5, wherein said etching step uses an etchant of hydrofluoric-nitric-acetic acid.

7. A method of fabricating a semiconductor structure as recited in claim 1, further comprising the step of:
   forming on said epitaxial layer, before the forming and patterning of said dielectric layer, an emitter layer of a semiconductor of the same conductivity type as said epitaxial layer and having a doping concentration substantially larger than the doping concentration of said epitaxial layer;
   wherein said patterning of said first dielectric layer includes an etching step that does not substantially etch said emitter layer.

8. A method of fabricating a semiconductor structure as recited in claim 6, further comprising the step of:
   forming on said epitaxial layer, before the forming and patterning of said dielectric layer, an emitter layer of a semiconductor of the same conductivity type as said epitaxial layer and having a doping concentration substantially larger than the doping concentration of said epitaxial layer; and
   wherein said patterning of said first dielectric layer includes an etching step that does not substantially etch said emitter layer.

9. A method of forming a semiconductor, as recited in claim 4, further comprising scribing alignment marks on said first substrate before said bonding steps with a laser.

10. A method of forming a semiconductor, as recited in claim 8, further comprising scribing alignment marks on said first substrate before said bonding steps with a laser.

* * * * *